(12) United States Patent
Löfgren et al.

(10) Patent No.: US 11,929,685 B2
(45) Date of Patent: Mar. 12, 2024

(54) VOLTAGE SOURCE CONVERTER AND A METHOD FOR OPERATION THEREOF

(71) Applicant: Bombardier Transportation GmbH, Berlin (DE)

(72) Inventors: Andreas Löfgren, Västerås (SE); Johan Dahlke, Västerås (SE); Stefan Roth, Västerås (SE)

(73) Assignee: BOMBARDIER TRANSPORTATION GMBH, Berlin (DE)

( * ) Notice: Subject to any disclaimer, the term of this patent is extended or adjusted under 35 U.S.C. 154(b) by 325 days.

(21) Appl. No.: 17/294,801

(22) PCT Filed: Nov. 7, 2019

(86) PCT No.: PCT/EP2019/080567
§ 371 (c)(1),
(2) Date: May 18, 2021

(87) PCT Pub. No.: WO2020/104204
PCT Pub. Date: May 28, 2020

(65) Prior Publication Data
US 2021/0408930 A1    Dec. 30, 2021

(30) Foreign Application Priority Data

Nov. 19, 2018   (SE) .................................... 1851435-6

(51) Int. Cl.
*H02M 5/293*    (2006.01)
*B60L 50/16*    (2019.01)
*H02M 5/14*    (2006.01)

(52) U.S. Cl.
CPC .......... *H02M 5/2932* (2021.05); *B60L 50/16* (2019.02); *H02M 5/14* (2013.01); *B60L 2200/26* (2013.01); *B60L 2210/20* (2013.01)

(58) Field of Classification Search
CPC ........ H02M 5/14; H02M 5/2932; B60L 50/16; B60L 2200/26; B60L 2210/20
(Continued)

(56) References Cited

U.S. PATENT DOCUMENTS

| | | | | |
|---|---|---|---|---|
| 2005/0024925 | A1* | 2/2005 | Deboy | H01L 27/0248 365/154 |
| 2014/0133186 | A1* | 5/2014 | Balakrishnan | H01L 23/49575 363/17 |
| 2015/0162272 | A1* | 6/2015 | Balakrishnan | H02M 3/003 363/21.12 |

FOREIGN PATENT DOCUMENTS

| | | | | |
|---|---|---|---|---|
| EP | 2020751 | A2 | 2/2009 | |
| EP | 2733740 | A2 | 5/2014 | |
| EP | 3236567 | A1 * | 10/2017 | ............. H02M 1/08 |

* cited by examiner

*Primary Examiner* — Yemane Mehari
(74) *Attorney, Agent, or Firm* — Dilworth & Barrese, LLP

(57) ABSTRACT

A voltage source converter has a half bridge (18) with two current valves (19, 20) connected in series and an arrangement configured to carry out voltage measurements for determining a value of the DC voltage between opposite poles (21, 22) of a DC side of the converter. Each current valve comprises a semiconductor device (23, 24) controlled by an associated gate drive member (29, 30), each forming gate drive parts of one gate drive unit (28) in common to both current valves. The gate drive unit (28) comprises an isolated two-way communication link (33) between the gate drive members. The arrangement is included in the gate drive unit and configured to measure the entire DC voltage between said opposite poles (21, 22). A converter control device (31) calculates and sends control signals to the gate drive unit based on the result of the voltage measurement.

7 Claims, 3 Drawing Sheets

(58) Field of Classification Search
USPC .......................................................... 323/217
See application file for complete search history.

VOLTAGE SOURCE CONVERTER AND A METHOD FOR OPERATION THEREOF

TECHNICAL FIELD OF THE INVENTION

The present invention relates to a voltage source converter comprising
a half bridge with two current valves connected in series and configured to be connected to opposite poles of a DC source/load, each said current valve comprising a semiconductor device of turn-off type and a rectifying diode connected in anti-parallel therewith, a midpoint of the half bridge between the two current valves forming an AC side of the converter and being configured to be connected to an AC load/source,
two gate drive members each comprising a logic device and a gate drive stage configured to control the semiconductor device of a current valve each to turn on and off according to control signals from a converter control device,
a said converter control device configured to send control signals to said gate drive members for controlling the operation of the converter according to a Pulse Width Modulation pattern for creating an AC fundamental voltage and current on said AC side, and
an arrangement configured to carry out voltage measurements for providing a value of the DC voltage between said opposite poles to a first said logic device configured to send information about said DC voltage value to the converter control device.

The invention is not restricted to any particular use of such a converter, but the use thereof in a track-bound vehicle, such as a rail vehicle, will in some parts of this disclosure be explained for illuminating the invention but accordingly not restrict the invention to that application.

Such a converter is used for converting a direct voltage to an alternating voltage or vice versa for different purposes. Thus, either the AC side is considered to be the load and the DC side the source as for a motor converter or conversely as for a line converter. The invention is not restricted to any number of phases of the voltage applied to a said AC side, although three phase voltages are most common, neither is the invention restricted to any particular levels of such voltages or electric power to be fed through the converter. Thus, in case of three phase voltages the converter has at least three said half bridges (each phase may theoretically have a plurality of half bridge modules connected in parallel for allowing high currents) between the opposite poles of the DC side.

The semiconductor device of the current valves may be any semiconductor device of turn-off type, for example an IGBT or a MOSFET.

The control of a converter of the type defined in the introduction, especially when used for high-power applications, such as providing electric energy to driving motors of railway vehicles, usually requires information about the level of the DC voltage on the DC side of the converter. One reason for this is that it has to be prevented that the semiconductor devices of the current valves are exerted to too high voltages. The value of the DC voltage determined by said arrangement may for that sake be used for the control of a chopper through which the level of the DC voltage may be controlled. The exact value of the DC voltage is also useful as input to the control of the gate drive members when trying to optimize the switching of the current valves.

The converter control device is for simplicity and in order to avoid expensive high voltage insulation of its supply and most of its communication ports tied to ground potential, i.e. to the carbody, but the converter main circuit may be either negative grounded, i.e. with its negative direct voltage pole tied via a return conductor to the running rails, or mid point grounded, i.e. having a high impedance voltage divider connected between its positive and negative poles with the mid point of the voltage divider connected to ground, i.e. to the carbody. In the latter case an electrically insulating communication channel between the converter control device and the gate drive unit is obviously necessary, but also in case of negative grounding this is preferred in order to avoid electromagnetic interference and to enable dielectric testing of the main circuit without temporary disconnection of a communication link.

BACKGROUND ART

It is known to use separate voltage measurement devices, e.g. a closed loop voltage transducer, as arrangement for carrying out voltage measurements for determining a value of the DC voltage between the opposite poles in a voltage source converter of the type defined in the introduction. However, costs and effort for producing and mounting such measurement devices are high and separate power supplies are required. Furthermore, redundant measurement devices may then also be necessary in order to guarantee the operation of the converter.

For solving these problems it is suggested in WO 2007/059985 to use existing voltage measurement devices, which are integrated in the valve control units, to provide the converter control device with information about the DC voltage across the respective current valve. In that approach the voltage across the current valve with the semiconductor device turned off is then measured for obtaining a value of said DC voltage. Although this known converter concept is well functioning there is of course an ongoing attempt to improve the properties of such a converter.

SUMMARY OF THE INVENTION

The object of the present invention is to provide a voltage source converter and a method for operation thereof of the type defined in the introduction being improved in at least some aspect with respect to known such converters and methods.

This object is with respect to the converter obtained by providing such a converter with the features herein.

Thus, the two gate drive members form gate drive parts of one gate drive unit in common to both current valves and this gate drive unit contains an electrically isolating two-way communication link interconnecting the gate drive members. The arrangement is included in the gate drive unit and comprises a voltage divider connected across the two current valves so as to measure the entire DC voltage between the opposite poles, and the converter control device is configured to calculate and send control signals to the gate drive unit based on the result of the measurement carried out by the arrangement.

One advantage of the converter according to the invention is that by including the gate drive members for the two current valves in one gate drive unit and providing an isolated two-way communication link between the gate drive members the converter control device may control the entire phase, i.e. both current valves, through a single control signal telling the entire phase what to do, for instance to turn either current valve on or both current valves off. By the communication link between the two gate drive members these will now have the possibility to interact directly, which was not the case for known such phase configurations in which the two gate drive members were separated.

Furthermore, to have a voltage divider in common to both gate drive members results in a simpler design, which gives lower component count and an economical advantage with respect to known converters of this type. And by having the arrangement measuring the entire DC voltage included in the gate drive unit the use of voltage sensors in a DC link connecting the converter to a DC source/load may be omitted.

According to an embodiment of the invention said voltage divider has an output with one of said poles as reference potential, and said output is connected to processing parts which are included in one, first of said gate drive members. This helps to obtain a lower component count in combination with the high speed communication link to the converter control device, which is common for the entire gate drive unit.

According to another embodiment of the invention said first gate drive member is configured to send information about the DC voltage measured also directly to the second gate drive member and both gate drive members are configured to use information about this voltage to optimize the switching of the semiconductor device of the respective current valve. By the presence of the communication link between the gate drive members the switching of the semiconductor devices of the current valves may in this way be optimized.

According to another embodiment of the invention said first gate drive member is configured to directly use the value of the DC voltage measured by the arrangement for the control of said semiconductor device. This is a preferred way of obtaining the result obtainable through the preceding embodiment.

According to another embodiment of the invention the voltage source converter comprises three said half bridges each having a said gate drive unit with two said gate drive members for creating a three phase AC fundamental voltage and current on said AC side. This is the type of converter used for providing electric energy to driving motors of railway vehicles and then also sending electric energy from the electric machines constituting the motors when the vehicle is braking and these machines function as generators to the DC side of the converter.

According to another embodiment of the invention the converter comprises an even number of said half-bridges each having a said gate drive unit with two said gate drive members with each pair of half-bridges configured to be connected to one secondary winding of an AC line railway vehicle main transformer and for creating a single phase AC fundamental voltage and current between them on said AC side. Thus, this converter is configured to be used as a line converter.

According to another embodiment of the invention a said arrangement is included in the gate drive unit for each said phase. Since several gate drive units will by this provide measurements of the same DC voltage the redundancy/fault tolerance of the system is increased.

According to another embodiment of the invention the semiconductor device of the current valves are IGBTs (Insulated Gate Bipolar Transistors) or MOSFETs (Metal Oxide Semiconductor Field Effect Transistors).

According to another embodiment of the invention the converter is a track-bound vehicle converter configured to be arranged on board a track-bound vehicle and being for example a motor converter configured to deliver power through said AC side of the converter to a motor used to drive the vehicle or an auxiliary converter configured to deliver a voltage on said AC side of the converter to be used for the heating/cooling system of the vehicle and for electrical appliances, such as through sockets arranged in said vehicle. This is a preferred application of a voltage source converter of this type.

The object is with respect to the method obtained by providing a method according to the description herein, and the advantages of such a method and possible embodiments thereof, such as defined herein, appear clearly from the above discussion of the voltage source converter according to the invention.

The invention also relates to a computer program, a computer program product, an electronic converter control unit and a track-bound vehicle according to the description herein.

Further advantages as well as advantageous features of the invention will appear from the following description of an embodiment of the invention.

BRIEF DESCRIPTION OF THE DRAWINGS

With reference to the appended drawings, below follows a specific description of an embodiment of the invention cited as an example. In the drawings.

DETAILED DESCRIPTION OF AN EMBODIMENT OF THE INVENTION

Figure 1:
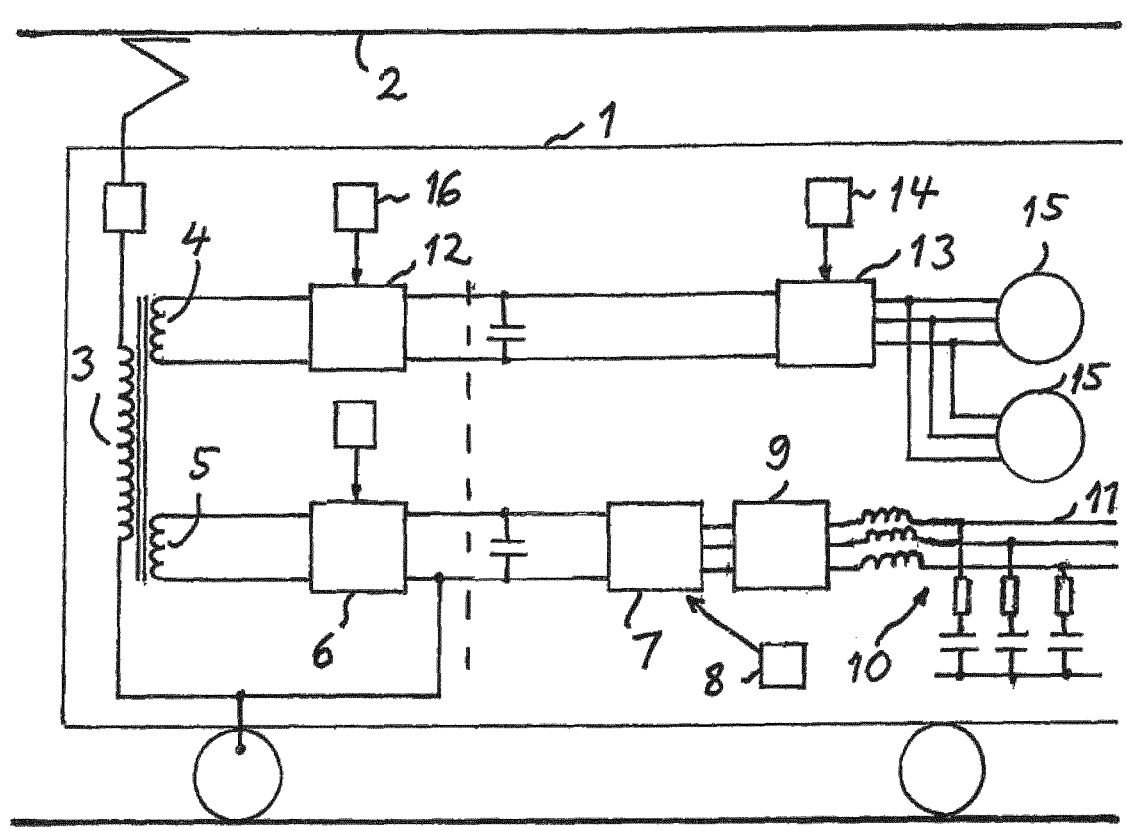
FIG. 1 is a very schematic view illustrating how different types of converters of the type to which the present invention is directed may be arranged and controlled in a track-bound vehicle.

Since the present invention is particularly suited for being used in track-bound vehicles some possible ways of using a voltage source converter according to the invention will now be briefly described with reference made to FIG. 1 without restricting the invention to that field of use. FIG. 1 illustrates schematically how electric power may be fed to a track-bound vehicle 1 from an AC-supply line 2 and used in said vehicle. The vehicle is configured to move along the AC-supply line 2, which accordingly acts as an AC-source and which may for example carry a single phase alternating voltage of 15 kV and 16⅔ Hz (Sweden, Germany etc.) or 25 kV and 50 Hz (Denmark, China, India etc.). The vehicle has a transformer 3 for transforming the voltage from the supply line 2 to a suitable level. The transformer has here two secondary windings 4, 5, one of which being connected to a line converter 6 for delivering a direct voltage of for example 0.8-3 kV on the output thereof. This direct voltage is delivered to an auxiliary converter 7, which is controlled by a converter control device 8 for generating a train of pulses according to a Pulse Width Modulation pattern for delivering a three phase alternating voltage on the output thereof. The output of this converter is connected to a three phase transformer 9 as well as harmonic filters 10 for smoothing out the alternating voltage delivered by a distribution network 11 to sockets arranged in the track-bound vehicle, such as for connection of computers, and to lighting, heating and other appliances.

The other secondary winding 4 of the transformer is connected to a line converter 12 configured to deliver a direct voltage on the output thereof to the input of a voltage source converter in the form of a motor converter 13 for delivering a three phase alternating voltage on the output thereof to motors 15 in the form of electric machines, for driving the vehicle. Each converter 12, 13 is controlled by a converter control device 16, 14 which determines the PWM pattern of the converter. The motor converter control device 14 will receive orders from the driver of the vehicle for adapting the frequency (induction machine) or phase angle (permanent magnet machine) of the fundamental voltage delivered to the stator windings of the motors to the tractive effort/traction force commanded. In the case of braking the vehicle electric power will flow in the direction from the motors to the AC-supply line through the line converter 12 controlled to deliver a single phase alternating voltage on the AC side thereof. The converters 6, 7, 12 and 13 may be voltage source converters according to the present invention. It is pointed out that the electric system shown in FIG. 1 is only one of several possible appearances of an electric system in a track-bound vehicle.

Figure 2:
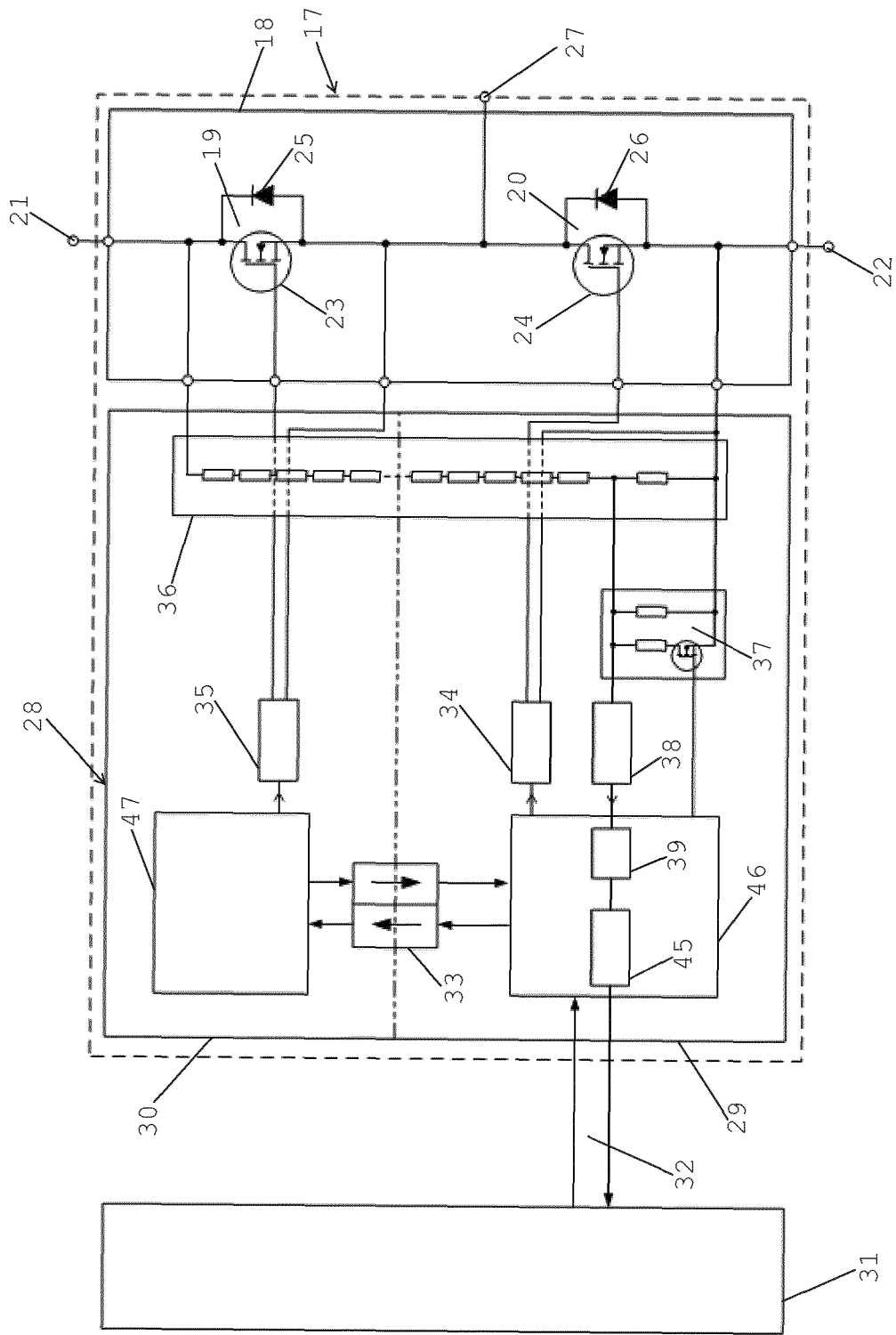
FIG. 2 is a schematic circuit diagram of a converter half bridge according to an embodiment of the present invention.

A single phase of a voltage source converter 17 according to an embodiment of the invention is schematically illustrated in FIG. 2. The voltage source converter has for each phase a half bridge module 18 with two current valves 19, 20 connected in series and configured to be connected to opposite poles 21, 22 of a DC source or load, such as a DC voltage intermediate link connected to the converters 7 and 13 shown in FIG. 1. Each current valve has a semiconductor device 23, 24 of turn-off type in the form of a MOSFET (an IGBT may do just as well) and a rectifying diode 25, 26 connected in anti-parallel therewith. A midpoint of the half bridge between the two current valves forms an AC side 27 of the converter and is configured to be connected to an inductive impedance, in this case of an AC load.

The voltage source converter has for each phase a gate drive unit 28 with a first gate drive member 29 configured to control the MOSFET 24 of a first current valve 20 and a second gate drive member 30 configured to control the MOSFET 23 of the other, second current valve 19 to turn on and off (typically with a switching frequency of a few kHz) for creating an AC voltage and current on the AC side 27.

A converter control device 31 in common to the gate drive units of the three phases is configured to send control signals to each phase through a high speed isolated two-way communication link 32 to the gate drive unit 28 for controlling the operation of the converter, in which the control signals are first received by the first gate drive member 29 which process said signal into separate ON/OFF control signals for itself by a logic device 46 and for the second gate drive member 30 and sends the latter through an isolated two-way communication link 33 to a logic device 47 interconnecting the gate drive members so that the gate drive stages 34, 35 turn the respective MOSFET 24, 23 on or off so as to produce the intended PWM.

For the operation of the converter it is of importance to know the value of the DC voltage between the poles 21, 22 on the DC side thereof, and this value has to be determined for ensuring that this voltage will never reach a level detrimental to the power semiconductor devices (the MOSFETs) of the current valves. The voltage source converter does for this purpose have an arrangement configured to carry out voltage measurements for determining a value of said DC voltage, and this arrangement is included in the gate drive unit 28 and comprises a voltage divider 36 connected across the two current valves so as to measure the entire DC voltage between the opposite poles 21, 22 of the DC link. Such a fixed resistive voltage divider delivers a low-voltage measurement signal that can be further processed. The same voltage divider hardware may be used for power semiconductor devices, such as IGBTs, used for different voltages, such as rated for 1.7 kV and 3.3 kV. The voltage measuring arrangement consists of a resistive voltage divider 36 and processing parts 37, 38, 39, 45. The processing parts are included in the first gate drive member 29 and consists of a member 37 for selecting the final voltage division factor of said arrangement, a low-pass filter 38, an analog to digital converter 39 and a digital low-pass filter 45. The voltage division factor is controlled by logic device 46.

Impedance matching to logic device 46 is provided by low-pass filter 38. Information about the resulting DC voltage value is sent through the high speed communication link 32 to the converter control device 31 with a rate of update within in the order of 10 µs, together with other phase status information. The converter control device is configured to calculate and send the control signals to the gate drive unit 28 based on the result of the measurement so carried out by the DC voltage measuring arrangement.

The information about the DC voltage measured by the arrangement may be used by the converter control device together with load currents measured by separate current sensors (not shown) for calculating turn-on/off times of the semiconductor devices of the current valves. The gate drive unit in the voltage converter according to the invention may autonomously use the DC voltage value information for optimizing switching of the power semiconductor devices, especially for turn-on in the case of IGBTs. The first gate drive member 29 including the arrangement will then directly use the voltage value measured by the arrangement, whereas the other gate drive member 30 uses the value sent from the first gate drive member 29 through the communication link 33.

Figure 3:
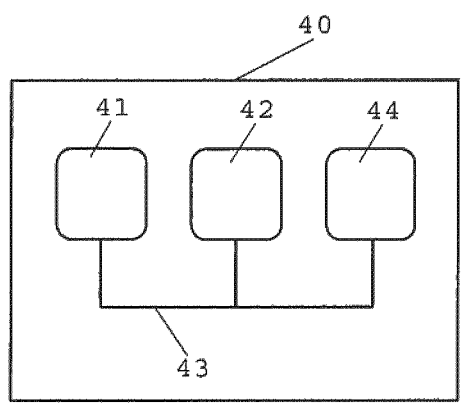
FIG. 3 is a schematic view illustrating an electronic converter control unit for implementing the invention.

Computer program code for implementing a method according to the invention is with advantage included in a computer program which can be read into the internal memory of a computer, e.g. the internal memory of an electronic converter control unit of a track-bound vehicle. Such a computer program is with advantage provided with a computer program product comprising a data storage medium which can be read by a computer and which has the computer program stored on it. FIG. 3 illustrates very schematically an electronic converter control unit 40 comprising an execution means 41, e.g. a central processor unit (CPU) for execution of computer software. The execution means 41 communicates with a memory 42, e.g. of the RAM type, via a data bus 43. The electronic converter control unit 40 also comprises a non-transitory data storage medium 44, e.g. in the form of a flash memory or a memory of the ROM, PROM, EPROM or EEPROM type. The execution means 41 communicates with the data storage medium 44 via the data bus 43. The computer program comprises computer program code for implementing a method according to the invention.

The invention is of course in no way restricted to the embodiment described above, since many possibilities for modifications thereof are likely to be obvious to one skilled in the art without having to deviate from the scope of the invention defined in the appended claims.

It is for redundancy advantageous to have a voltage measuring arrangement in each gate drive unit of a multiple phase voltage source converter, but it is within the scope of the invention to have an arrangement in only one or two of the gate drive units in the case of a three phase voltage source converter.

Furthermore, one gate drive unit may control a plurality of half bridge semiconductor modules connected in parallel but belonging to the same phase, for instance four modules connected in parallel and each having two current valves connected in series making a total of 8 current valves for that phase.

The invention claimed is:

1. A voltage source converter comprising
a half bridge (18) with two current valves (19, 20) connected in series and configured to be connected to opposite poles (21, 22) of a DC source/load, each said current valve comprising a semiconductor device (23, 24) of turn-off type and a rectifying diode (25, 26) connected in anti-parallel therewith, a midpoint of the half bridge between the two current valves forming an AC side (27) of the converter and being configured to be connected to an AC load/source,
two gate drive members (29, 30) each comprising a logic device (46, 47) and a gate drive stage (34, 35) configured to control the semiconductor device (23, 24) of a current valve (19, 20) each to turn on and off according to control signals from a converter control device (31),
said converter control device (31) configured to send control signals to said gate drive members (29, 30) for controlling the operation of the converter according to a Pulse Width Modulation pattern for creating an AC fundamental voltage and current on said AC side, and
an arrangement configured to carry out voltage measurements for providing a value of the DC voltage between said opposite poles (21, 22) to a first said logic device configured to send information about said DC voltage value to the converter control device (31),
wherein said two gate drive members (29, 30) form gate drive parts of one gate drive unit (28) in common to both current valves (19, 20),
said gate drive unit contains an electrically isolating two-way communication link (33) interconnecting said gate drive members,
said arrangement is included in said gate drive unit (28) and comprises a voltage divider (36) connected across the two current valves (19, 20) to measure the entire DC voltage between said opposite poles (21, 22), and
the converter control device (31) is configured to calculate and send said control signals to the gate drive unit (28) based on the result of a said measurement carried out by said arrangement,
said first gate drive member (29) is configured to send information about the DC voltage measured also directly to the second gate drive member (30),
both gate drive members (29, 30) are configured to use information about this voltage to optimize the switching of the semiconductor device (23, 24) of the respective current valve (19, 20),
said voltage divider (36) has an output with one of said poles (21, 22) as reference potential,
said output is connected to processing parts (37, 38, 39, 45) which are included in said first gate drive member (29), and
said first gate drive member (29) is configured to directly use the value of the DC voltage measured by the arrangement for the control of said semiconductor device (24).

2. The voltage source converter according to claim 1, comprising three said half-bridges (18) each having a said gate drive unit (28) with two said gate drive members (29, 30) for creating a three phase AC fundamental voltage and current on said AC side.

3. The voltage source converter according to claim 1, comprising an even number of said half-bridges (18) each having said gate drive unit (28) with two said gate drive members (29, 30) with each pair of half-bridges configured to be connected to one secondary winding of an AC line railway vehicle main transformer and for creating a single phase AC fundamental voltage and current between them on said AC side.

4. The voltage source converter according to claim 2, wherein said arrangement is included in the gate drive unit (28) for each said phase.

5. The voltage source converter according to claim 1, wherein the semiconductor devices (23, 24) of the current valves are IGBTs (Insulated Gate Bipolar Transistors) or MOSFETs (Metal Oxide Semiconductor Field Effect Transistors).

6. The voltage source converter according to claim 1, which is a track-bound vehicle converter (9, 13) configured to be arranged on board a track-bound vehicle (1) and being for example a motor converter (13) configured to deliver power through said AC side of the converter to a motor (15) used to drive the vehicle or an auxiliary converter (9) configured to deliver a voltage on said AC side of the converter to be used for the heating/cooling system of the vehicle and for electrical appliances, such as through sockets arranged in said vehicle.

7. A track-bound vehicle having at least one converter according to claim 1.

* * * * *